United States Patent
Ichihara

(10) Patent No.: US 6,434,373 B2
(45) Date of Patent: Aug. 13, 2002

(54) TRANSMISSION POWER CONTROL DEVICE CAPABLE OF DECREASING CURRENT CONSUMPTION

(75) Inventor: Masaki Ichihara, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/128,205

(22) Filed: Aug. 3, 1998

(30) Foreign Application Priority Data

Aug. 6, 1997 (JP) .............................................. 9-211092

(51) Int. Cl.$^7$ ................................................. H04B 1/04
(52) U.S. Cl. ........................................ 455/127; 455/574
(58) Field of Search ........................... 455/69, 117, 127, 455/13.4, 522, 574

(56) References Cited

U.S. PATENT DOCUMENTS

| | | | | |
|---|---|---|---|---|
| 4,380,089 A | * | 4/1983 | Weir | 455/127 |
| 5,107,225 A | | 4/1992 | Wheatley, III et al. | |
| 5,307,512 A | | 4/1994 | Mitzlaff | |
| 5,334,945 A | * | 8/1994 | Yokoya | 330/129 |
| 5,426,641 A | | 6/1995 | Afrashteh et al. | |
| 5,452,473 A | | 9/1995 | Weiland et al. | |
| 5,526,528 A | * | 6/1996 | Kurisu | 455/117 |
| 5,708,681 A | * | 1/1998 | Malkemes | 375/297 |
| 5,710,991 A | * | 1/1998 | Lee | 455/126 |
| 5,724,005 A | * | 3/1998 | Chen | 330/279 |
| 5,732,334 A | * | 3/1998 | Miyake | 455/126 |
| 5,739,712 A | | 4/1998 | Fujii | |
| 5,834,978 A | * | 11/1998 | Cho | 330/298 |
| 6,047,168 A | * | 4/2000 | Carlsson | 455/126 |
| 6,122,491 A | * | 9/2000 | Francisco | 455/127 |

FOREIGN PATENT DOCUMENTS

| | | |
|---|---|---|
| JP | 232221 | 2/1990 |
| JP | 4278705 | 10/1992 |
| JP | 565112 | 8/1993 |
| JP | 5300029 | 11/1993 |
| JP | 629751 | 2/1994 |
| JP | 6508012 | 9/1994 |
| JP | 6338729 | 12/1994 |
| JP | 8154022 | 6/1996 |
| JP | 9172380 | 6/1997 |

* cited by examiner

Primary Examiner—Daniel Hunter
Assistant Examiner—Nick Corsaro
(74) Attorney, Agent, or Firm—Dickstein, Shapiro, Morin & Oshinsky, LLP.

(57) ABSTRACT

A transmission power control device is for use in a radio communication apparatus. The transmission power control device comprises a processing section for processing an input transmission signal into a processed transmission signal in accordance with a control signal. A power amplifier circuit has a first transistor for amplifying the processed transmission signal into a power amplified transmission signal. The transmission power control device further comprises a detecting circuit for detecting a current flowing through the first transistor to produce a current detection signal. A converting circuit converts the control signal into a reference value signal corresponding to a level of the processed transmission signal. A bias current section compares the current detection signal with the reference value signal to produce a comparison result signal. The bias current section controls a bias current for the amplifier circuit in accordance with the comparison result signal.

20 Claims, 6 Drawing Sheets

TRANSMISSION POWER CONTROL DEVICE CAPABLE OF DECREASING CURRENT CONSUMPTION

BACKGROUND OF THE INVENTION

This Invention relates to a transmission power control device for controlling a transmission power in a radio communication apparatus such as a portable telephone.

In general, a portable telephone cannot operate without a battery which is used as a power source. In order to lengthen a talk time of the portable telephone, it is necessary to reduce a current consumption as little as possible in the portable telephone. During a transmission (conversation), the current is mostly consumed in a transmission power amplifier (high frequency power IC) in the portable telephone. Therefore, it is necessary to reduce the current consumption as little as possible in the transmission power amplifier. The portable telephone may be called a mobile terminal.

It is known that the portable telephone has a conventional transmission power control device for controlling a transmission power, in order to decrease the current consumption in the portable telephone.

On the other hand, it is required to vary a transmission power over a range of 80 dB in the portable telephone in order to avoid the near-far problem caused by a distance between a base station and the portable telephone in a CDMA mobile communication system such as IS 95. When a portable telephone is far from the base station, the portable telephone is inevitably subjected to interference by another portable telephone located near the base station.

In case where the conventional transmission power control device is used in the portable telephone of the CDMA system, it is difficult to widely vary the transmission power. As a result, it is impossible to lengthen the talk time of the portable telephone as will be described later.

SUMMARY OF THE INVENTION

It is therefore an object of this invention to provide a transmission power control device capable of widely varying a transmission power in a portable telephone of CDMA system, in order to lengthen a talk time of the portable telephone.

Other objects of this invention will become clear as the description proceeds.

On describing the gist of this invention, it is possible to understand that a transmission power control device is for use in a radio communication apparatus.

According to this invention, the transmission power control device comprises (A) processing means for processing an input transmission signal into a processed transmission signal in accordance with a control signal, (B) power amplifying means having a first transistor for amplifying the processed transmission signal into a power amplified transmission signal, (C) detecting means for detecting a current flowing through the first transistor to produce a current detection signal, (D) converting means for converting the control signal into a reference value signal corresponding to a level of the processed transmission signal, (E) bias current means for comparing the current detection signal with the reference value signal to produce a comparison result signal, the bias current means controlling a bias current for the amplifying means in accordance with the comparison result signal.

DESCRIPTION OF THE PREFERRED EMBODIMENT

Figure 1:
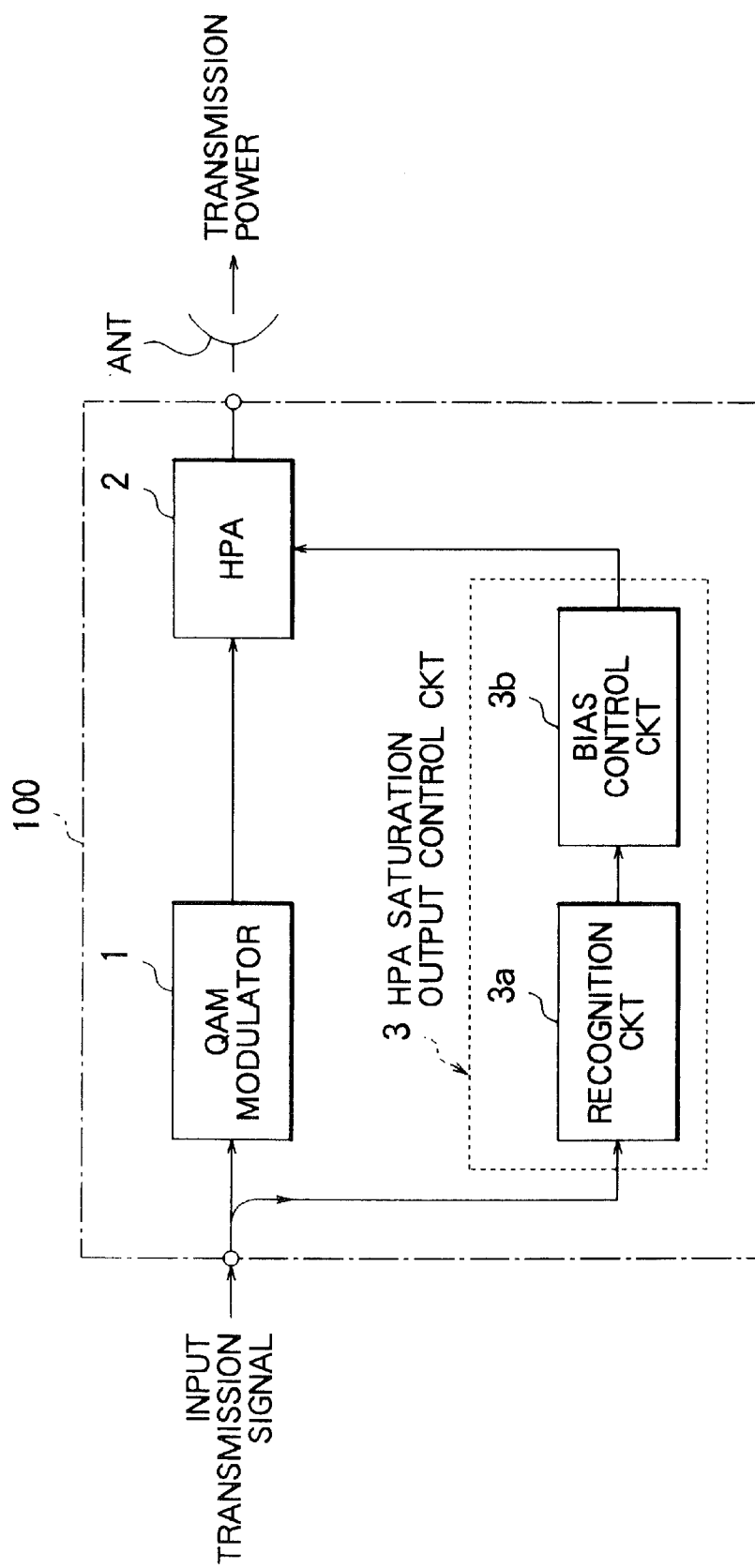
FIG. 1 is a block diagram of a conventional transmission power control device in a portable telephone.

Referring to FIG. 1, a conventional transmission power control device will be described at first in order to facilitate an understanding of this invention. In the example being illustrated, the illustrated transmission power control device is for use in a mobile station or terminal such as a portable telephone. The transmission power control device comprises an HPA saturation output control circuit 3 in FIG. 1. The portable telephone uses a multi-valued digital modulation such as 16-value QAM. Supplied with an analog multi-level signal having inphase (I) and quadrature (Q) components as an input transmission signal, a multi-valued QAM modulator 1 modulates the input transmission signal into modulated transmission signal. The modulated transmission signal is amplified into an amplified signal by a power amplifier (HPA) 2 to be transmitted as an output transmission signal through an antenna ANT by a transmission power.

The input transmission signal is further supplied to the HPA saturation output control circuit 3. The HPA saturation output control circuit 3 comprises a recognition circuit 3a and a bias control circuit 3b. Supplied with the input transmission signal, the recognition circuit 3a identifies where input symbols of the input transmission signal are located on a phase plane, in order to produce a recognition signal representative of locations of the input symbols. In accordance with the recognition signal, the recognition circuit 3a determines a peak level or value of each input symbol to supply the bias control circuit 3b to a peak level signal representative of the peak level of each input symbol. On the basis of the peak signal, the bias control circuit 3b supplies an optimum bias value to the power amplifier 2.

As readily understood from the above description, the HPA saturation output control circuit 3 controls the bias of the power amplifier 2 in accordance with the input transmission signal. As a result, an average current consumption is diminished in the power amplifier 2 on transmitting the multi-level digital signal.

However, it is impossible to widely vary a transmission power of the portable telephone over 80 dB in CDMA system inasmuch as the transmission power control device controls the bias of the power amplifier 2 in accordance with the peak level of each input symbol. As a result, it is difficult to lengthen a talk time of the portable telephone in case where the portable telephone has the transmission power control device illustrated in FIG. 1.

Figure 2:
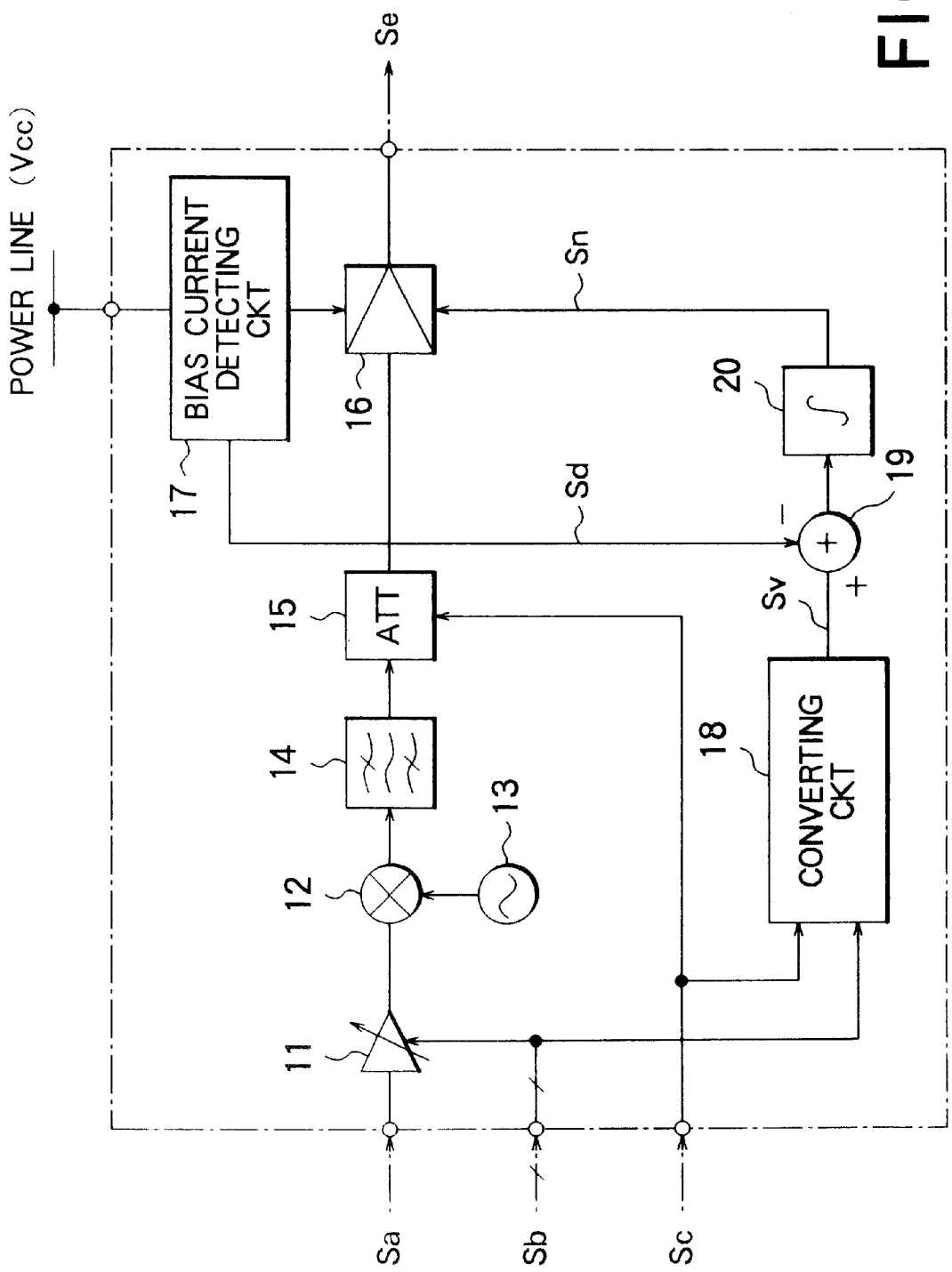
FIG. 2 is a block diagram of a transmission power control device according to a preferred embodiment of this invention.

Referring to FIG. 2, description will proceed to a transmission power control device according to a preferred embodiment of this invention.

The illustrated transmission power control device comprises a variable gain intermediate frequency (IF) amplifier 11. The variable gain IF amplifier 11 is supplied with an input IF signal Sa to variably amplify the input IF signal Sa into an amplified IF signal in accordance with a gain control signal Sb. The amplified IF signal is supplied to a mixer 12. The mixer 12 is connected to a local oscillator 13 to be supplied with a local oscillation signal. The mixer 12 mixes the local oscillation signal in the amplified IF signal to produce a high frequency signal having a predetermined frequency.

The high frequency signal is supplied to band-pass filter (BPF) 14. The BPF 14 filters the high frequency signal into a filtered signal in order to remove undesired frequencies from the high frequency signal. The filtered signal is delivered to a step-attenuator (ATT) 15. The step-attenuator (ATT) 15 attenuates the filtered signal into an attenuated signal on the basis of an attenuator control signal Sc. More particularly, the step-attenuator 15 is put into an on-state or an off-state in accordance with the attenuator control signal Sc to produce the attenuated signal. The attenuated signal is inputted to a power amplifier 16 which outputs a transmission power Se in accordance with a bias voltage Sn as will be described later.

The power amplifier 16 is connected to the power source Vcc through a bias current detecting circuit 17. As will be described later, a bias current is supplied to the power amplifier 16 through the bias current detecting circuit 17. Furthermore, the bias current detecting circuit 17 detects the bias current based on the power source Vcc to produce a bias current detection signal Sd representative of the value of the bias current.

The gain control signal Sb and the attenuator control signal Sc are supplied to a converter circuit 18. Responsive to the gain control signal Sb and the attenuator control signal Sc, the converter circuit 18 produces a reference value signal Sv representative of a level of the IF signal Sa. In other words, the reference value signal Sv is representative of a reference value of the bias current each time transmission power is varied. The reference value signal is supplied to a subtracter 19. The subtracter 19 is further supplied with the above-mentioned bias current detection signal Sd. The subtracter 19 subtracts the bias current detection signal Sd from the reference value signal Sv to produce a subtracted signal which is supplied to an integrator 20. The integrator 20 integrates the subtracted signal during a predetermined time duration to supply the power amplifier 16 with a integrated signal as the bias voltage Sn. The integrated signal is supplied to the power amplifier 16 as the bias voltage Sn shown in FIG. 3. The power amplifier 16 put into operation in a characteristic illustrated in FIG. 3.

Figure 4:
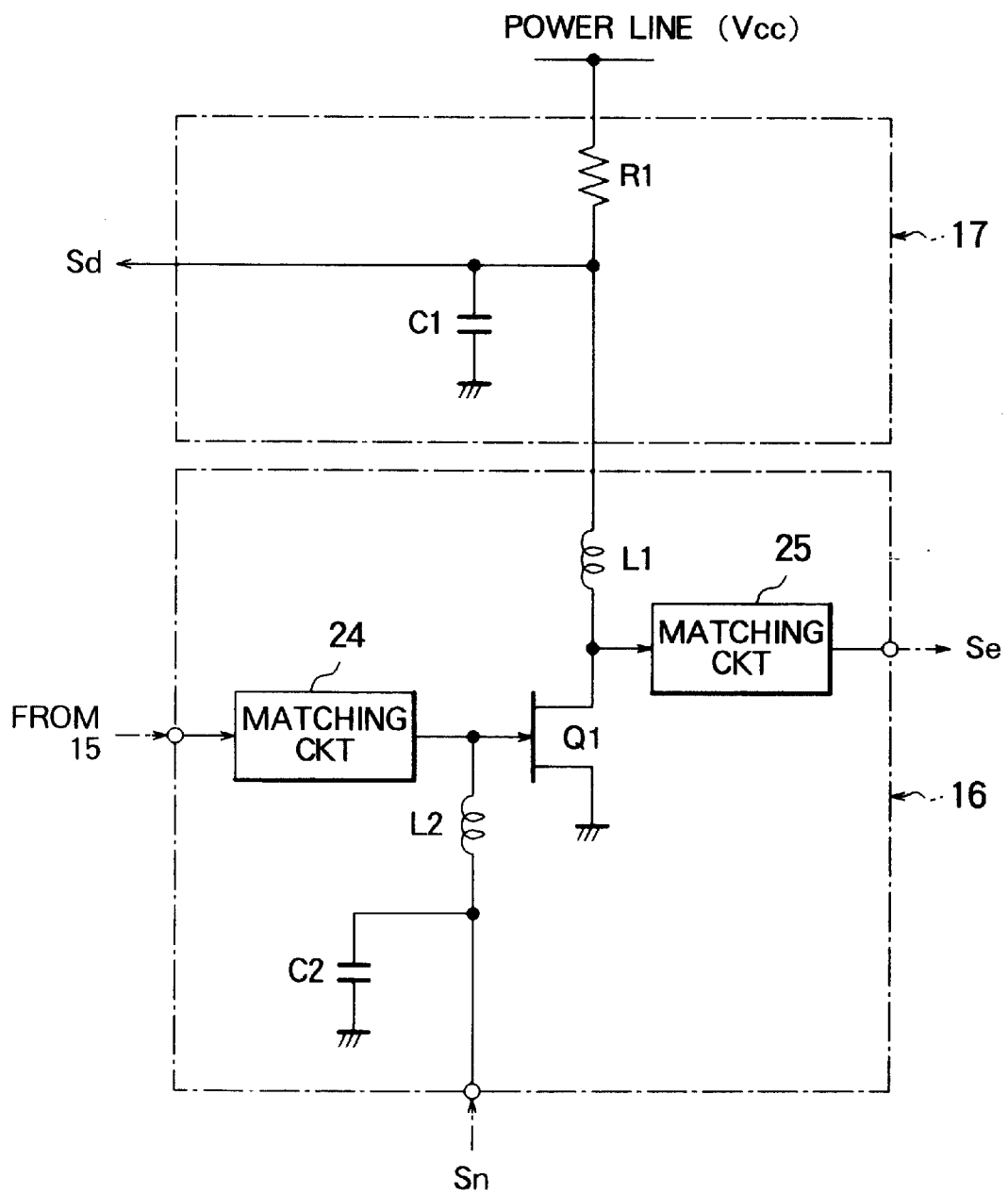
FIG. 4 is a circuit diagram for illustrating a power amplifier and a bias current detecting circuit of the transmission power control device illustrated in FIG. 2.

Referring to FIG. 4, description will proceed to an example of the power amplifier 16 and the bias current detecting circuit 17 illustrated in FIG. 2. The bias current detecting circuit 17 comprises a resistor R1 and a first capacitor C1. The power amplifier 16 comprises first and second matching circuits 24 and 15, first and second coils or inductors L1 and L2, a second capacitor C2, and a field effect transistor (FET) Q1. More particularly, the matching circuit 24 is composed of a tuning circuit (LC) for supplying the attenuated signal to the gate of the FET Q1 which amplifies the attenuated signal into the amplified signal. The matching circuit 24 is for matching the input impedance. The matching circuit 25 is connected to the drain of the FET Q1 in order to match an output impedance. The source of the FET Q1 is grounded. The drain of the FET Q1 is connected to coil L1 which is for preventing the attenuated signal from leakage to the bias current detecting circuit 17. The coil L1 may be provided in the bias current detecting circuit 17. The gate of the FET Q1 is connected to the coil L2 and the capacitor C2. The coil L2 is for preventing the attenuated signal from leakage to a bias voltage line. The capacitor C2 is for bypassing the attenuated signal.

In the bias current detecting circuit 17, the resistor R1 is connected to the power source Vcc and the coil L1. The capacitor C1 is a by-pass capacitor and is connected to a connection point between the resistor R1 and the coil L1. Furthermore, the capacitor C1 is grounded. A voltage drop based on the resistor R1 is supplied as the bias current detection signal Sd to the subtracter 19 illustrated in FIG. 2.

Referring to FIG. 4 in addition to FIG. 2, the attenuated signal is supplied to the power amplifier 16. In the power amplifier 16, the attenuated signal is supplied to the gate of FET Q1 through the matching circuit 24. Furthermore, the gate of the FET Q1 is supplied with the bias voltage Sn through the coil L2 and the capacitor C2. The FET Q1 amplifies the attenuated signal into the amplified signal in accordance with bias voltage Sn to output the amplified signal as the transmission power Se through the matching circuit 25.

As described above, the bias current detecting circuit 17 supplies the subtracter 19 with the bias current detection signal Sd which is representative of the drop voltage of the resistor R1. The subtracter 19 subtracts the bias current detection signal Sd from the reference value signal Sv to produce the subtracted signal. The integrator 20 produces the bias voltage Sn on the basis of the subtracted signal to supply the bias voltage Sn to the gate of the FET Q1.

In FIG. 4, a large current flows in the resistor R1 from the FET Q1. As a result, it is necessary to make the resistance of the resistor R1 be very small. When the resistance of the resistor R1 becomes very small, it is difficult to neglect the resistance of wirings in the power amplifier 16 and the bias current detecting circuit 17. As a result, the bias current detection signal Sd may have an error. In addition, the characteristic such as a linearity of amplification may be degraded in the power amplifier 16 inasmuch as the source voltage (Vcc) is reduced into a reduced voltage on the basis of the drop voltage of the resistor R1.

Figure 5:
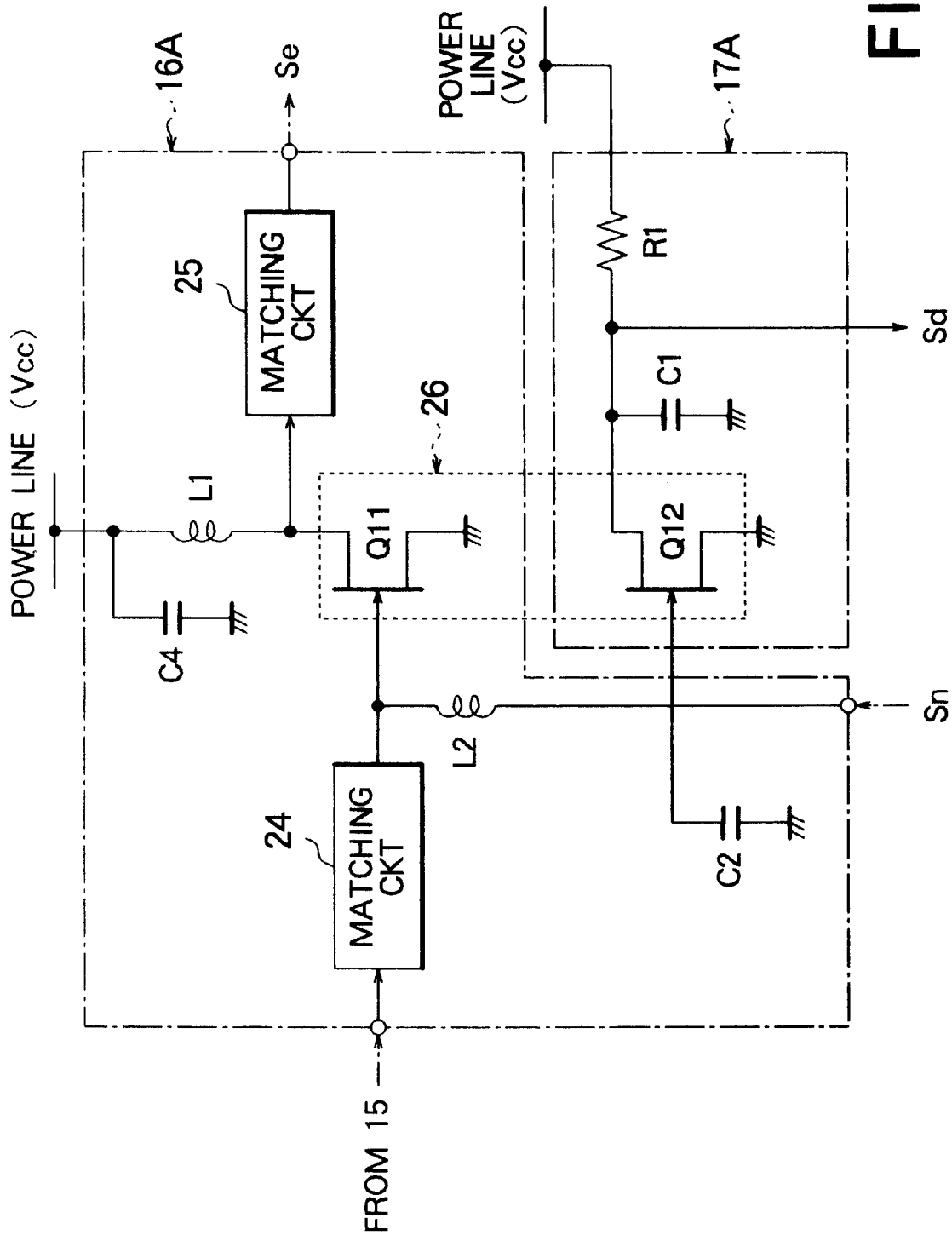
FIG. 5 is another circuit diagram for illustrating a power amplifier and a bias current detecting circuit of the transmission power control device illustrated in FIG. 2.

Referring to FIG. 5, description will proceed to another example of the power amplifier 16 and the bias current detecting circuit 17 illustrated in FIG. 2.

In FIG. 5, the power amplifier and the bias current detecting circuit are designated by reference numerals 16A and 17A, respectively. The power amplifier 16A and the bias current detecting circuit 17A comprise similar parts which are designated by like reference numerals. The power amplifier 16A comprises a first transistor Q11 which is for use in power amplification. The first transistor Q11 may be, for example, an FET. The bias current detection circuit 17A comprises a second transistor FET Q12 which is used as an auxiliary transistor. The second transistor Q12 may be, for example, an FET. In the example being illustrated, the gate width of the second transistor Q12 is proportionately reduced from that of the first transistor FET Q11. The gate width of the second transistor Q12 is designed to be one tenth of that of the first transistor Q11. The second transistor Q12 and the first transistor Q11 are built on the same semiconductor chip 26, in order to hold a precisely proportional relationship between the first and the second transistors Q11 and Q12. In other words, a DC bias current passing in the second transistor Q12 becomes about one tenth of a DC bias current passing in the first transistor Q11 when a condition of the DC biasing in second transistor Q12 is same as a condition of the DC biasing current in the first transistor Q11.

The power amplifier 16A comprises the matching circuit 24 on the input side, the matching circuit on the output side, the first transistor Q11, the coil L1, the coil L2, and a capacitor C2. In the power amplifier 16A, the source of the first transistor Q11 is grounded and the drain of the first transistor Q11 is connected to the power line (Vcc) through the coil L1. The power amplifier 16A comprises the capacitor C4 which is used as a bypass capacitor for a high frequency signal. In the bias current detecting circuit 17A, the source of the second transistor Q12 is grounded. The resistor R1 and the capacitor C1 are located between the drain of the second transistor Q12 and the power line (Vcc). The capacitor C1 is used as a bypass capacitor for a high frequency signal. The drop voltage of the resistor R1 is supplied as the bias current detection signal Sd to the subtracter 19 illustrated in FIG. 2.

Referring to FIG. 5 in addition to FIG. 2, the power amplifier 16A is supplied with the attenuated signal. In the power amplifier 16A, the attenuated signal is supplied to the gate of the first transistor Q11 through the matching circuit 24. Furthermore, the bias voltage Sn is supplied to the gate of the first transistor Q11 through the coil L2 and a capacitor C2. The first transistor Q11 amplifies the attenuated signal into the amplified signal in accordance with the bias voltage Sn to output the amplified signal as the transmission power Se through the matching circuit 25.

As described above, the gate width of second transistor Q12 is defined to one tenth of FET Q11. As a result, the DC bias current passing in the second transistor Q12 becomes about one tenth of the DC bias current passing in the first transistor Q11 when the condition of the DC biasing in second transistor Q12 is same as a condition of the DC biasing in the first transistor Q11.

In accordance with the bias voltage Sn, the current flows to the drain of the second transistor Q12 through the resistor R1. The voltage drop occurs in the resistor R1. The drop voltage is supplied as the bias current detection signal Sd to the subtracter 19 illustrated in FIG. 2. As described above, the subtracter 19 subtracts the bias current detection signal Sd from the reference value signal Sv to produce subtracted signal. The integrator 20 supplies the bias voltage Sn to the gate of the first transistor Q11 in accordance with the subtracted signal.

In FIG. 5, a current flows to the resistor R1 from the second transistor Q12. As described above, the current flowing in the second transistor Q12 is equal to one tenth of the current flowing in the first transistor Q11. As a result, it is possible to make the resistance of the resistor R1 be large. It is possible to neglect the resistance of wirings in the power amplifier 16A and the bias current detecting circuit 17A. The bias current detecting signal seldom has the error. In addition, the characteristic such as the linearity of amplification is not degraded in the power amplifier 16 inasmuch as the resistor R1 is not connected to the drain of the first transistor Q11.

Figure 3:
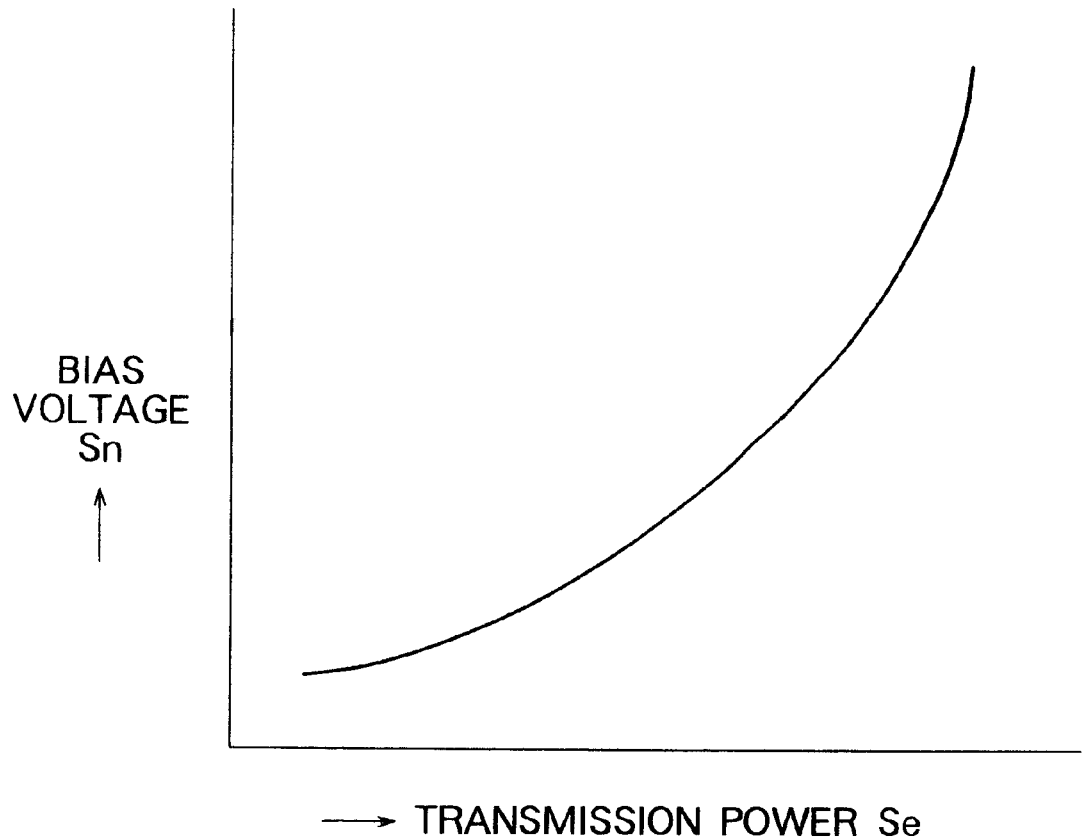
FIG. 3 shows a view for describing a characteristic of the power amplifier.
Figure 6:
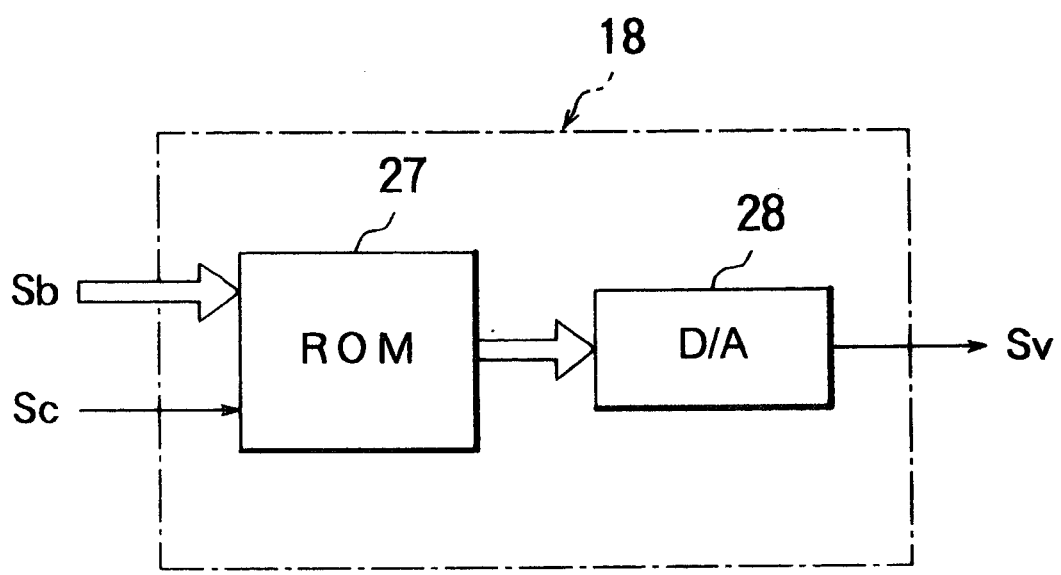
FIG. 6 is a circuit diagram for illustrating a converting circuit of the transmission power control device illustrated in FIG. 2.

Referring to FIG. 6, description will proceed to an example of the converting circuit 18 illustrated in FIG. 2. The converting circuit 18 comprises a read-only-memory (ROM) 27 and a digital-analog (D/A) converter 28. The converting circuit 18 is supplied with the gain control signal Sb and the attenuator control signal Sc as addresses. In the example being illustrated, each of the the gain control signal Sb and the attenuator control signal Sc has a digital signal form. The ROM 17 has a conversion table for producing the reference value signal Sv in response to the gain control signal Sb and the attenuator control signal Sc. More particularly, the ROM 27 has the conversion table containing data of the reference value signal Sv as reference data of bias current points. The bias current points are representative of levels of the input IF signal. The reference data in the conversion table corresponds to the characteristic of the power amplifier 16 that is illustrated in FIG. 3. As described above, the reference value signal Sv is representative of the reference value of the bias current of the FET Q1 (Q11). The D/A converter 28 converts the reference value signal Sv into a analog reference value signal which is supplied to the subtracter 19 illustrated in FIG. 2.

As readily understood from the above-mentioned description, the bias current point of the power amplifier 16 (16A) varies in accordance with the attenuated signal. Therefore, the current consumption decreases in the power amplifier in correspondence to the bias current point on decreasing the transmission power Se. As a result, the power amplifier 16 (16A) always operates in the bias voltage Sn which is most appropriate to the transmission output power Se.

Although the amplified IF signal Sa is converted into the high frequency signal by the mixer 12 and the local oscillator 13 in the above-mentioned embodiment, the mixer 12 and the local oscillator 13 may be unnecessary. In addition, either one of the variable gain amplifier 11 and the attenuator 15 may be unnecessary. In case where the variable gain amplifier 11 is unnecessary, the converting circuit 18 produces the reference value signal Sv in accordance with only the attenuator control signal Sc. In case where the attenuator 15 is unnecessary, the converting circuit 18 produces the reference value signal Sv in accordance with only the gain control signal Sb.

Although the transmission power control device has the subtracter 19 for subtracting the bias current detection signal from the reference value signal in the above-mentioned embodiment, the transmission power control device may have an adder instead of the subtracter 19 for carrying a sum of the bias current detection signal and the reference value signal, in order to compensate the reference value signal in accordance with the current flowing in the FET Q1(Q11). In addition, the transmission power control device may have a comparator circuit and a voltage variable amplifier instead of the subtracter 19. The comparator circuit compares the reference value signal with the bias current detection signal to produce a comparison result. The voltage variable amplifier amplifies the reference value signal in accordance with the comparison result. Furthermore, an EEPROM) is used instead of the ROM.

While this invention has thus far been described in conjunction with the preferred embodiments thereof, it will readily be possible for those skilled in the art to put this invention into practice in various other manners.

What is claimed is:

1. A transmission power control device for use in a radio communication apparatus, comprising:

processing means for processing an input transmission signal into a processed transmission signal;

power amplifying means having a first transistor for amplifying said processed transmission signal into a power amplified transmission signal;

said processing means processing said input transmission signal into the processed transmission signal in accordance with a control signal which is independent of the power amplified transmission signal;

detecting means for detecting a current flowing through said first transistor to produce a current detection signal;

converting means for converting the control signal into a reference value signal corresponding to a level of said processed transmission signal, said reference value signal being representative of a reference value of a bias current of said first transistor each time transmission power of said power amplified transmission signal is varied; and bias current means for comparing said current detection signal with said reference value signal to produce a comparison result signal, said bias current means varying said bias current in accordance with said comparison result signal to reduce said bias current on decreasing said transmission power.

2. A transmission power control device as claimed in claim 1, wherein said detecting means comprises a detecting resistor inserted in a path of source current flowing from a power source to said first transistor, said detecting resistor detecting a drop voltage thereof to produce said drop voltage as said current detection signal.

3. A transmission power control device as claimed in claim 1, wherein said detecting means comprises:

a second transistor which operates under a condition of a DC bias current similar to that of said first transistor; and a detecting resistor inserted in a path of source current flowing from a power source to said second transistor, said detecting resistor detecting a drop voltage thereof to produce said drop voltage as said current detection signal.

4. A transmission power control device as claimed in claim 3, wherein said first and said second transistors are formed on a same semiconductor chip.

5. A transmission power control device as claimed in claim 1, wherein said converting means comprises:

memory means for memorizing said reference value signal as reference value data corresponding to the level of said processed transmission signal in each level of said control signal as an address; said memory means outputting said reference value data in accordance with said control signal; and D/A converter means for converting said reference value data into an analog signal to produce said analog signal as said reference value signal.

6. A transmission power control device as claimed in claim 5, wherein said memory means is composed of a rewriteable memory.

7. A transmission power control device as claimed in claim 1, wherein said bias current means comprises:

comparator means comparing said current detection signal with said reference value signal to produce said comparison result signal; and supplying means for supplying a bias voltage to said amplifying means in accordance with said comparison result signal.

8. A transmission power control device as claimed in claim 7, wherein said supplying means is composed of a integrator circuit for integrating said comparison result signal during a predetermined time duration to supply said bias voltage to said amplifying means.

9. A transmission power control device as claimed in claim 7, wherein said comparator means comprises subtracter means for subtracting said current detection signal from said reference value signal to produce a subtracted signal as said comparison result signal.

10. A transmission power control device as claimed in claim 1, wherein:

said control signal has a gain control signal and an attenuator control signal;

said processing means comprising:

amplifying means for amplifying said input transmission signal into an amplified signal on the basis of said gain control signal; and attenuator means for attenuating said amplified signal into an attenuated signal on the basis of said attenuator control signal to supply said attenuated signal as said processed signal to said power amplifying means.

11. A transmission power control device as claimed in claim 1, wherein:

said control signal has a gain control signal and an attenuator control signal;

said processing means comprising:

amplifying means for amplifying said input transmission signal into an amplified signal on the basis of said gain control signal;

frequency converting means for frequency-converting said amplified signal into a frequency-converted signal; and attenuator means for attenuating said frequency-converted signal into an attenuated signal on the basis of said attenuator control signal to supply said attenuated signal as said processed signal to said power amplifying means.

12. A transmission power control device as claimed in claim 1, wherein:

said control signal has a gain control signal and an attenuator control signal;

said processing means comprising:

amplifying means for amplifying said input transmission signal into an amplified signal on the basis of said gain control signal;

frequency converting means for frequency-converting said amplified signal into a frequency-converted signal;

band-pass filter means filtering said frequency-converted signal into a filtered signal; and attenuator means for attenuating said filtered signal into an attenuated signal on the basis of said attenuator control signal to supply said attenuated signal as said processed signal to said power amplifying means.

13. A transmission power control device as claimed in claim 1, wherein:

said control signal is a gain control signal;

said processing means comprising:

amplifying means for amplifying said input transmission signal into an amplified signal on the basis of said gain control signal to supply said amplified signal as said processed signal to said power amplifier means.

14. A transmission power control device as claimed in claim 1, wherein:

said control signal is a gain control signal;

said processing means comprising:

amplifying means for amplifying said input transmission signal into an amplified signal on the basis of said gain control signal; and frequency converting means for frequency-converting said amplified signal into a frequency-converted signal to supply said frequency-converted signal as said processed signal to said power amplifier means.

15. A transmission power control device as claimed in claim 1, wherein:

said control signal is a gain control signal;

said processing means comprising:
- amplifying means for amplifying said input transmission signal into an amplified signal on the basis of said gain control signal;
- frequency converting means for frequency-converting said amplified signal into a frequency-converted signal; and
- band-pass filter means filtering said frequency-converted signal into a filtered signal to supply said filtered signal to said power amplifier means.

16. A transmission power control device as claimed in claim 1, wherein:

said control signal is an attenuator control signal;

said processing means comprising:
- attenuator means for attenuating said input transmission signal into an attenuated signal on the basis of said attenuator control signal to supply said attenuated signal as said processed signal to said power amplifying means.

17. A transmission power control device as claimed in claim 1, wherein:

said control signal is an attenuator control signal;

said processing means comprising:
- frequency converting means for frequency-converting said input transmission signal into a frequency-converted signal; and
- attenuator means for attenuating said frequency-converted signal into an attenuated signal on the basis of said attenuator control signal to supply said attenuated signal as said processed signal to said power amplifying means.

18. A transmission power control device as claimed in claim 1, wherein:

said control signal is an attenuator control signal;

said processing means comprising:
- frequency converting means for frequency-converting said input transmission signal into a frequency-converted signal;
- band-pass filter means filtering said frequency-converted signal into a filtered signal; and
- attenuator means for attenuating said filtered signal into an attenuated signal on the basis of said attenuator control signal to supply said attenuated signal as said processed signal to said power amplifying means.

19. A transmission power control device as claimed in claim 1, wherein said radio communication apparatus is for use in a CDMA system.

20. A transmission power control device as claimed in claim 3, wherein said second transistor is not connected to said first transistor.

* * * * *